(12) United States Patent
Lee et al.

(10) Patent No.: US 11,221,438 B2
(45) Date of Patent: Jan. 11, 2022

(54) POLARIZING FILM AND DISPLAY APPARATUS EMPLOYING THE SAME

(71) Applicant: Samsung Display Co., Ltd., Yongin-si (KR)

(72) Inventors: Dukjin Lee, Yongin-si (KR); Woosuk Jung, Yongin-si (KR); Minha Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 98 days.

(21) Appl. No.: 16/717,974

(22) Filed: Dec. 17, 2019

(65) Prior Publication Data

US 2020/0271844 A1    Aug. 27, 2020

(30) Foreign Application Priority Data

Feb. 21, 2019 (KR) .......................... 10-2019-0020493

(51) Int. Cl.
*G02B 5/30* (2006.01)
*H01L 51/52* (2006.01)
*H01L 27/32* (2006.01)

(52) U.S. Cl.
CPC ........ *G02B 5/3083* (2013.01); *H01L 51/5284* (2013.01); *H01L 27/3244* (2013.01); *H01L 51/5253* (2013.01)

(58) Field of Classification Search
USPC .......................................................... 257/91
See application file for complete search history.

(56) References Cited

U.S. PATENT DOCUMENTS

| 7,738,063 | B2 | 6/2010 | Jeon et al. | |
|---|---|---|---|---|
| 2014/0166995 | A1* | 6/2014 | Lee | H01L 51/5259 257/40 |
| 2016/0259104 | A1* | 9/2016 | Lee | H01L 51/5237 |
| 2018/0259699 | A1 | 9/2018 | Aimatsu et al. | |
| 2018/0329125 | A1 | 11/2018 | Hikita et al. | |
| 2018/0370184 | A1 | 12/2018 | Ito et al. | |
| 2020/0142255 | A1* | 5/2020 | Kitagawa | H01L 27/32 |

FOREIGN PATENT DOCUMENTS

| JP | 2017-016089 | 1/2017 |
|---|---|---|
| KR | 10-0561066 | 3/2006 |
| KR | 10-2015-0073177 | 6/2015 |
| KR | 10-1847714 | 4/2018 |
| KR | 10-2018-0084775 | 7/2018 |
| KR | 10-2018-0096615 | 8/2018 |

* cited by examiner

*Primary Examiner* — Nduka E Ojeh
(74) *Attorney, Agent, or Firm* — H.C. Park & Associates, PLC

(57) ABSTRACT

A polarizing film including a polarizing layer, a reversed wavelength dispersion quarter waveguide (QWP) disposed on the polarizing layer, and a light-absorbing layer disposed on the polarizing layer, in which the light-absorbing layer includes a light absorber to absorb light having a wavelength in a range of about 380 nm to about 430 nm.

18 Claims, 10 Drawing Sheets

FIG. 8

| | RELATED ART | | | EXEMPLARY EMBODIMENTS | | | IMPROVEMENT |
|---|---|---|---|---|---|---|---|
| | a* | b* | Chroma | a* | b* | Chroma | Chroma |
| IDEAL | 0.00 | 0.00 | 0.00 | 0.00 | 0.00 | 0.00 | 0 |
| (a) | -0.20 | -0.57 | 0.60 | -0.09 | -0.35 | 0.36 | 0.24 |
| (b) | -0.32 | -1.22 | 1.26 | -0.11 | -0.77 | 0.77 | 0.48 |
| (c) | -0.54 | -2.06 | 2.13 | -0.19 | -1.43 | 1.45 | 0.69 |
| (d) | -1.25 | -3.13 | 3.37 | -0.74 | -2.25 | 2.36 | 1.00 |

POLARIZING FILM AND DISPLAY APPARATUS EMPLOYING THE SAME

CROSS-REFERENCE TO RELATED APPLICATION

This application claims priority from and the benefit of Korean Patent Application No. 10-2019-0020493, filed on Feb. 21, 2019, which is hereby incorporated by reference for all purposes as if fully set forth herein.

BACKGROUND

Field

Exemplary embodiments of the invention relate to a polarizing film and a display apparatus employing the same, and more specifically, to a polarizing film including a light-absorbing layer and a display apparatus employing the polarizing film.

Discussion of the Background

A display apparatus for forming an image may include a liquid crystal display (LCD), an organic light-emitting diode (OLED) display device, and an electrophoretic display (EPD) device, or the like. In general, a display apparatus may employ a polarizing film to prevent external light from being reflected by a front surface of the display apparatus.

The above information disclosed in this Background section is only for understanding of the background of the inventive concepts, and, therefore, it may contain information that does not constitute prior art.

SUMMARY

A polarizing film constructed according to exemplary embodiments of the invention and a display apparatus including the same have excellent anti-reflection characteristics and reflection chroma characteristics.

Additional features of the inventive concepts will be set forth in the description which follows, and in part will be apparent from the description, or may be learned by practice of the inventive concepts.

A polarizing film according to an exemplary embodiment includes a polarizing layer, a reversed wavelength dispersion quarter waveplate (QWP) disposed on the polarizing layer, and a light-absorbing layer disposed on the polarizing layer, in which the light-absorbing layer includes a light absorber to absorb light having a wavelength in a range of about 380 nm to about 430 nm.

A wavelength dispersion value DSP of the reversed wavelength dispersion QWP at a wavelength of 450 nm and a light transmittance of the polarizing film at a wavelength 430 nm may satisfy: $T(430 \text{ nm}) \leq 8.7875 e^{(-3.715 \times DSP(450 \text{ nm}))}$, in which T(430 nm) denotes a light transmittance at a wavelength of 430 nm, DSP denotes a wavelength dispersion value at a wavelength of 450 nm and is R(450 nm)/R (550 nm), and R($\lambda$) denotes a phase difference value at a wavelength of $\lambda$.

A light transmittance of the polarizing film with to light having a wavelength in a range of about 380 nm to about 430 nm may be less than 40%.

The light absorber may include at least one of anthraquinone-based dyes, methine-based dyes, azomethine-based dyes, oxadine-based dyes, azo-based dyes, styryl-based dyes, coumarin-based dyes, porphyrin-based dyes, dibenzofuranone-based dyes, diketopyrrolopyrrole-based dyes, rhodamine-based dyes, kisanten-based dyes, and pyrromethene-based dyes.

The light-absorbing layer may include at least one of tri-acetyl cellulose (TAC), cyclo olefin polymer, and polymethyl methacrylate (PMMA).

The light-absorbing layer may include a pressure-sensitive adhesive.

The polarizing film may further include a first protective layer and a second protective layer respectively disposed on a bottom surface and a top surface of the polarizing layer, in which each of the first protective layer and the second protective layer may include at least of tri-acetyl cellulose (TAC), cyclo olefin polymer, and polymethyl methacrylate (PMMA).

The polarizing film may further include an adhesive layer disposed on a bottom surface of the reversed wavelength dispersion QWP.

The polarizing layer may include a dichroic dye in polyvinyl alcohol (PVA).

The reversed wavelength dispersion QWP may satisfy: DSP(450 nm)=R(450 nm)/R(550 nm)<1, and DSP(650 nm)=R(650 nm)/R(550 nm)>1, in which DSP($\lambda$) denotes a wavelength dispersion value DSP of the reversed wavelength dispersion QWP at a wavelength of $\lambda$, and R($\lambda$) denotes a phase difference value at a wavelength of $\lambda$.

A display apparatus according to another exemplary embodiment includes a substrate, a plurality of display elements disposed on the substrate, a sealing member sealing the plurality of display elements, and a polarizing film disposed on the sealing member, in which the polarizing film includes a polarizing layer, a reversed wavelength dispersion quarter waveplate (QWP) disposed on the polarizing layer, and a light-absorbing layer disposed on the polarizing layer, in which the light-absorbing layer includes a light absorber to absorb light having a wavelength in a range of about 380 nm to about 430 nm.

A wavelength dispersion value DSP of the reversed wavelength dispersion QWP at a wavelength of 450 nm and a light transmittance of the polarizing film at a wavelength 430 nm may satisfy: $T(430 \text{ nm}) \leq 8.7875 e^{(-3.715 \times DSP(450 \text{ nm}))}$, in which T(430 nm) denotes a light transmittance at a wavelength of 430 nm, DSP denotes a wavelength dispersion value at a wavelength of 450 nm and is R(450 nm)/R (550 nm), and R($\lambda$) denotes a phase difference value at a wavelength of $\lambda$.

A light transmittance of the polarizing film to light having a wavelength in a range of about 380 nm to about 430 nm may be less than 40%.

The light absorber may include at least one of anthraquinone-based dyes, methine-based dyes, azomethine-based dyes, oxadine-based dyes, azo-based dyes, styryl-based dyes, coumarin-based dyes, porphyrin-based dyes, dibenzofuranone-based dyes, diketopyrrolopyrrole-based dyes, rhodamine-based dyes, kisanten-based dyes, and pyrromethene-based dyes.

The light-absorbing layer may include a pressure-sensitive adhesive, in which the light-absorbing layer may be disposed between the reversed wavelength dispersion QWP and the sealing member.

The sealing member may be a thin-film encapsulation layer including a first inorganic encapsulation layer, an organic encapsulation layer, and a second inorganic encapsulation layer sequentially stacked one over another.

The sealing member may include a sealing substrate.

The display apparatus may further include a first protective layer and a second protective layer respectively disposed on a bottom surface and a top surface of the polarizing layer, in which each of the first protective layer and the second protective layer may include at least one of tri-acetyl cellulose (TAC), cyclo olefin polymer, and polymethyl methacrylate (PMMA).

The light-absorbing layer may include at least one of tri-acetyl cellulose (TAC), cyclo olefin polymer, and polymethyl methacrylate (PMMA).

The reversed wavelength dispersion QWP may satisfy: DSP(450 nm)=R(450 nm)/R(550 nm)<1, and DSP(650 nm)=R(650 nm)/R(550 nm)>1, in which DSP($\lambda$) denotes a wavelength dispersion value DSP of the reversed wavelength dispersion QWP at a wavelength of $\lambda$, and R($\lambda$) denotes a phase difference value at a wavelength of $\lambda$.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 8 is a table showing a chroma change in the related art and exemplary embodiments.

DETAILED DESCRIPTION

Figure 1:
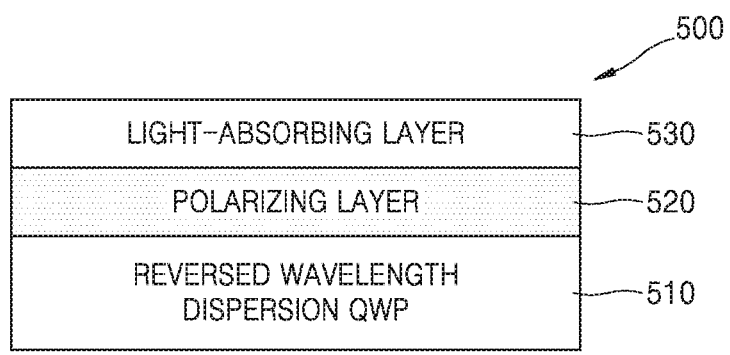
FIG. 1 is a cross-sectional view of a polarizing film according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view of a polarizing film 500 according to an exemplary embodiment.

Referring to FIG. 1, the polarizing film 500 according to an exemplary embodiment includes a polarizing layer 520, a reversed wavelength dispersion quarter waveplate (hereinafter, a reversed wavelength dispersion QWP) 510, and a light-absorbing layer 530.

The polarizing layer 520 polarizes light incident from a light source into light having the same direction as that of a polarization axis. In some exemplary embodiments, the polarizing layer 520 may be formed by including a polarizer and/or a dichroic dye in a polyvinyl alcohol (PVA) film. The dichroic dyes may be iodine molecules and/or dye molecules.

In some exemplary embodiments, the polarizing layer 520 may be formed by elongating a PVA film in one direction and dipping the PVA film in an iodine and/or dielectric dye solution. In this case, iodine molecules and/or dichroic dye molecules are arranged in a direction parallel to an elongation direction. Because the iodine molecules and the dye molecules exhibit dichroism, light vibrating in the elongation direction may be absorbed and light vibrating in a direction perpendicular to the elongation direction may be transmitted.

The reversed wavelength dispersion QWP 510 may be located on a side of the polarizing layer 520, and may circularly polarize polarized light passing through the polarizing layer 520 by delaying a phase by λ/4. Accordingly, a light reflectance may be reduced. The reversed wavelength dispersion QWP 510 may be located further away from a light source than the polarizing layer 520. For example, when external light is incident from the above of the polarizing layer 520, the reversed wavelength dispersion QWP 510 may be located under the polarizing layer 520.

The reversed wavelength dispersion QWP 510 may be dependent on a wavelength, and may reduce a phase delay value for a shorter wavelength. A wavelength dispersion value DSP of the reversed wavelength dispersion QWP 510 may be expressed as $DSP(\lambda)=R(\lambda)/R(550\ nm)$, where $R(\lambda)$ denotes a phase difference value at a wavelength of $\lambda$, and may satisfy:

$$DSP(450\ nm)=R(450\ nm)/R(550\ nm)<1,\ \text{and}$$

$$DSP(650\ nm)=R(650\ nm)/R(550\ nm)>1.$$

Figure 2A:
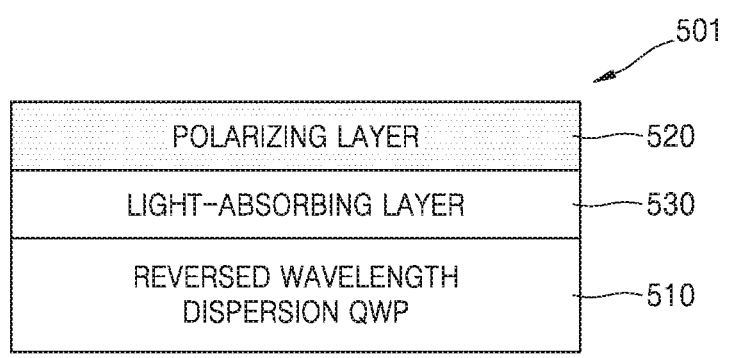
FIG. 2A is a cross-sectional view of a polarizing film according to another exemplary embodiment.

The light-absorbing layer 530 may be located on a side of the polarizing layer 520. Although FIG. 1 shows the light-absorbing layer 530 being located over the polarizing layer 520, the inventive concepts are not limited thereto. For example, in the polarizing film 501 as shown in FIG. 2A, the light-absorbing layer 530 may be located between the polarizing layer 520 and the reversed wavelength dispersion QWP 510. In another exemplary embodiment, the polarizing film 502 shown in FIG. 2B may include the light-absorbing layer 530 located under the reversed wavelength dispersion QWP 510.

The light-absorbing layer 530 according to an exemplary embodiment may reduce a reflection chroma. As such, the light-absorbing layer 530 may absorb light of a short wavelength range in a visible light range, that is, light having a wavelength ranging from about 380 nm to about 430 nm.

The light-absorbing layer 530 may include a light absorber for absorbing light having a wavelength ranging from about 380 nm to about 430 nm. For example, the light-absorbing layer 530 may include a light absorber, such as anthraquinone-based dyes, methine-based dyes, azomethine-based dyes, oxadine-based dyes, azo-based dyes, styryl-based dyes, coumarin-based dyes, porphyrin-based dyes, dibenzofuranone-based dyes, diketopyrrolopyrrole-based dyes, rhodamine-based dyes, kisanten-based dyes, and pyrromethene-based dyes.

A light transmittance of the light-absorbing layer 530 may be adjusted by adjusting the amount of the light absorber included in the light-absorbing layer 530. A light transmittance T of the polarizing film 500 by the light-absorbing layer 530 may satisfy $$T(430\ nm) \le 8.7875 e^{(-3.715 \times DSP(450\ nm))}$$

where T(430 nm) denotes a light transmittance at a wavelength of 430 nm. DSP denotes a wavelength dispersion value at a wavelength of 450 nm. The wavelength dispersion value DSP is R(450 nm)/R(550 nm), and R($\lambda$) denotes a phase difference value at a wavelength of $\lambda$.

When the light transmittance T satisfies the above condition, the transmission of light generated under the polarizing film 500 and traveling towards a top surface of the polarizing film 500 may be ensured, and a color shift of light generated over the polarizing film 500 and reflected by the top surface of the polarizing film 500 may be minimized. That is, a reflection chroma of light reflected by the top surface of the polarizing film 500 may be reduced. Such a mechanism will be described in more detail with reference to FIGS. 3 through 5.

The light-absorbing layer 530 may function as a protective layer that supports the polarizing layer 520 and compensates for a mechanical strength of the polarizing layer 520. In this case, the light-absorbing layer 530 may include tri-acetyl cellulose (TAC), cyclo olefin polymer, and polymethyl methacrylate (PMMA).

In some exemplary embodiments, the polarizing film 500 may further include various elements, such as a protective layer, a support layer, an adhesive layer, and a hard coating layer in addition to the reversed wavelength dispersion QWP 510, the polarizing layer 520, and the light-absorbing layer 530.

Figure 2B:
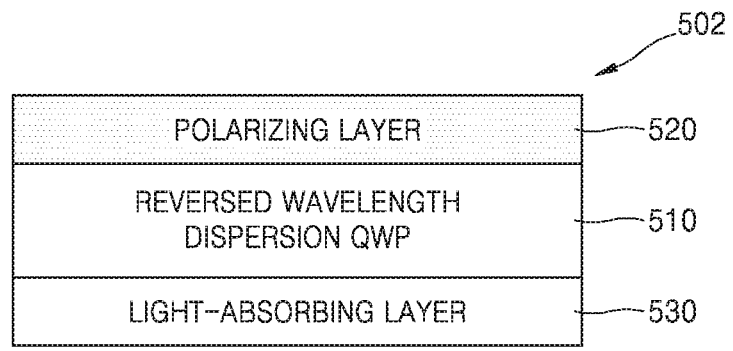
FIG. 2B is a cross-sectional view of a polarizing film according to another exemplary embodiment.
Figure 2C:
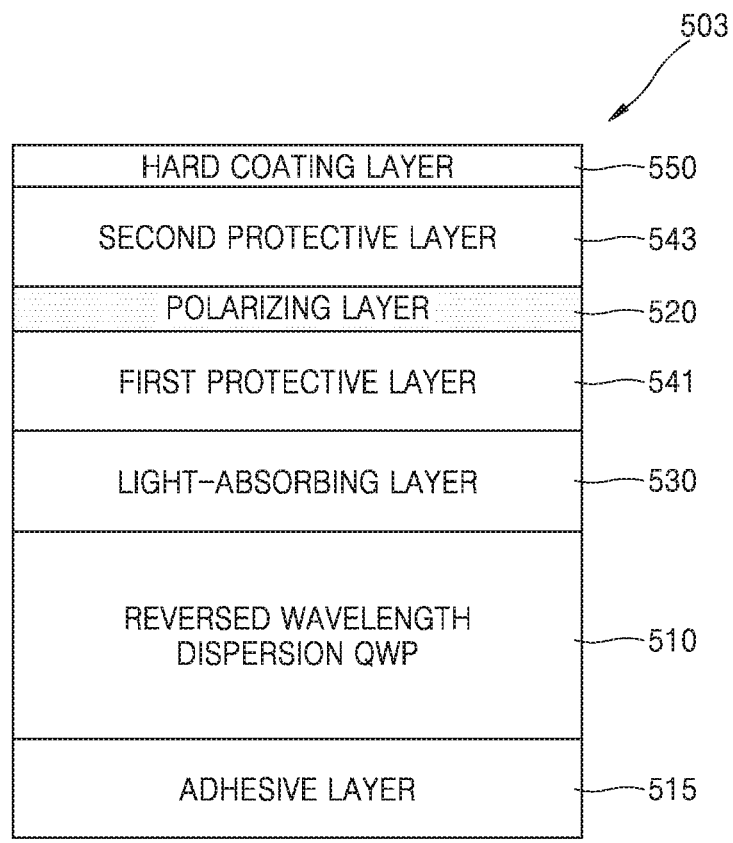
FIG. 2C is a cross-sectional view of a polarizing film according to another exemplary embodiment.

FIGS. 2A through 2C are cross-sectional views of a polarizing film according to exemplary embodiments. In FIGS. 2A through 2C, the same elements as those of FIG. 1 are denoted by the same reference numerals, and thus, repeated descriptions thereof will be omitted to avoid redundancy.

Referring to FIG. 2A, a polarizing film 501 according to an exemplary embodiment may include the reversed wavelength dispersion QWP 510, the light-absorbing layer 530, and the polarizing layer 520, which are sequentially stacked. The light-absorbing layer 530 may be located between the reversed wavelength dispersion QWP 510 and the polarizing layer 520.

The light-absorbing layer 530 may absorb light ranging from about 380 nm to about 430 nm, and may function as a protective layer that supports the polarizing layer 520 and compensates for a mechanical strength of the polarizing layer 520. In this case, the light-absorbing layer 530 may include TAC, cyclo olefin polymer, and PMMA.

The light-absorbing layer 530 may attach the polarizing layer 520 to the reversed wavelength dispersion QWP 510. In this case, the light-absorbing layer 530 may include an adhesive. The adhesive may be a pressure-sensitive adhesive (PSA).

Referring to FIG. 2B, a polarizing film 502 according to an exemplary embodiment may include the light-absorbing layer 530, the reversed wavelength dispersion QWP 510, and the polarizing layer 520, which are sequentially stacked. The light-absorbing layer 530 may be located on a bottom surface of the reversed wavelength dispersion QWP 510.

In this case, the light-absorbing layer 530 may include a material for absorbing light having a wavelength ranging from about 380 nm to about 430 nm, and may include an adhesive. The adhesive may be a PSA.

Because the light-absorbing layer 530 is located on the bottom surface of the reversed wavelength dispersion QWP 510, the light-absorbing layer 530 may attach the polarizing film 502 to a display apparatus.

Referring to FIG. 2C, a polarizing film 503 according to an exemplary embodiment may include an adhesive layer 515, the reversed wavelength dispersion QWP 510, the light-absorbing layer 530, a first protective layer 541, the polarizing layer 520, a second protective layer 543, and a hard coating layer 550, which are sequentially stacked.

The adhesive layer 515 may be located on a bottom surface of the reversed wavelength dispersion QWP 510, and may include a PSA. The adhesive layer 515 may attach the polarizing film 503 to a display apparatus.

The reversed wavelength dispersion QWP 510 may circularly polarize light incident on the polarizing film 503 along with the polarizing layer 520. The reversed wavelength dispersion QWP 510 may be dependent on a wavelength, and may reduce a phase delay value for a shorter wavelength.

The first protective layer 541 and the second protective layer 543 may be respectively located on a bottom surface and a top surface of the polarizing layer 520. The first protective layer 541 and the second protective layer 543 may function as protective layers that support the polarizing layer 520 and compensate for a mechanical strength of the polarizing layer 520. The first protective layer 541 and the second protective layer 543 may each include TAC, cyclo olefin polymer, and PMMA.

The hard coating layer 550 may be located on an uppermost portion of the polarizing film 503 to protect elements of the polarizing film 503 from an external impact. The hard coating layer 550 may have a scratch preventing function and may have a strength of about 9 H.

Although FIG. 2C shows that the light-absorbing layer 530 is located between the reversed wavelength dispersion QWP 510 and the first protective layer 541, however, the inventive concepts are not limited thereto. For example, a position of the light-absorbing layer 530 may be changed, and an additional light-absorbing layer 530 may be further formed.

In another exemplary embodiment, at least one of the hard coating layer 550, the first protective layer 541, the second protective layer 543, and the adhesive layer 515 may function as the light-absorbing layer 530. For example, a light absorber that may be included in the light-absorbing layer 530 may also be included in at least one of the hard coating layer 550, the first protective layer 541, the second protective layer 543, and the adhesive layer 515.

The light-absorbing layer 530 may include a light absorber, and may absorb light having a wavelength ranging from about 380 nm to about 430 nm. A light transmittance of the polarizing film 503 by the light-absorbing layer 530 may satisfy $$T(430\ nm) \le 8.7875 e^{(-3.715 \times DSP(450\ nm))}$$

where T(430 nm) denotes a light transmittance at a wavelength of 430 nm. DSP denotes a wavelength dispersion value at a wavelength of 450 nm. The wavelength dispersion value DSP is R(450 nm)/R(550 nm), and R($\lambda$) denotes a phase difference value at a wavelength of $\lambda$.

Each of the polarizing films 500, 501, 502, and 503 according to exemplary embodiments may include the light-absorbing layer 530, which may reduce a reflection chroma and ensure excellent visibility.

Hereinafter, an operation mechanism of the light-absorbing layer 530 will be described with reference to FIGS. 3 through 5.

The reversed wavelength dispersion QWP 510 according to exemplary embodiments may not accurately adjust a phase delay of $\lambda/4$ according to a wavelength, due to the characteristics of a material of the reversed wavelength dispersion QWP 510. More particularly, a wavelength dispersion value DSP of the reversed wavelength dispersion QWP 510 may vary according to a material thereof.

Figure 3:
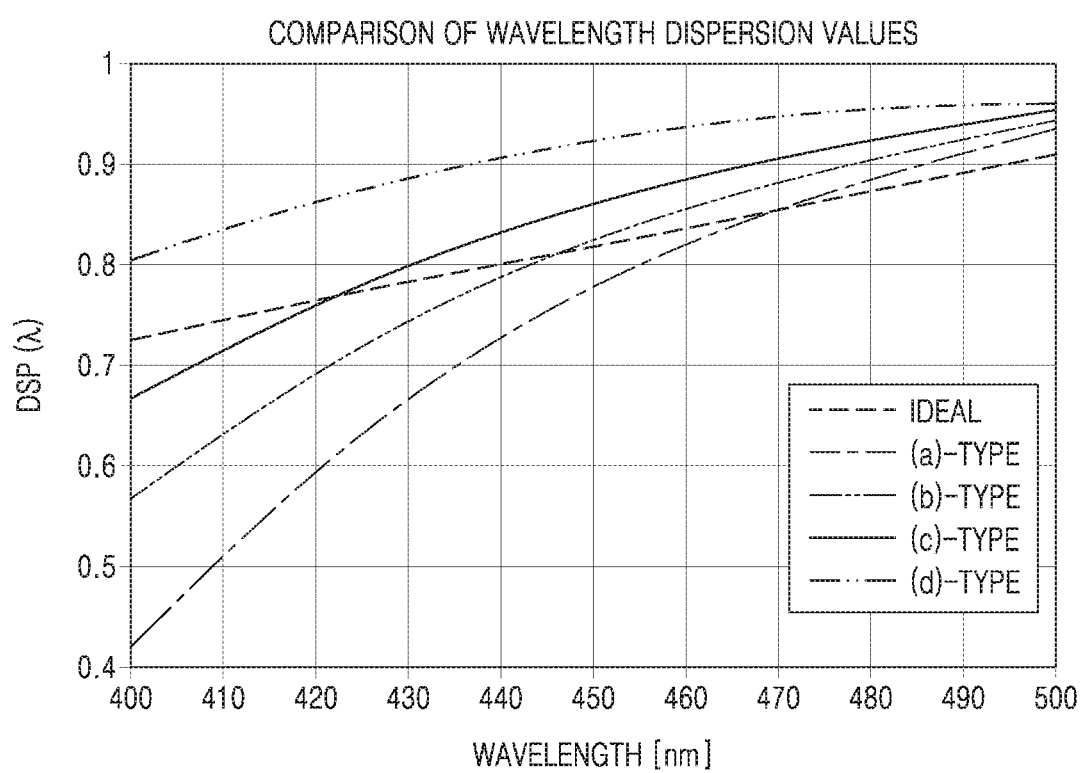
FIG. 3 is a graph showing wavelength dispersion values of (a) to (d)-type reversed wavelength dispersion quarter waveplates (QWPs).

FIG. 3 is a graph showing wavelength dispersion values DSP of (a) to (d)-type reversed wavelength dispersion QWPs. FIG. 4 illustrate reflection chromas of the (a) to (d)-type reversed wavelength dispersion QWPs in CIE L*a*b* coordinates.

A wavelength dispersion value DSP shown in FIG. 3 is a ratio of a phase difference value according to a wavelength of λ, that is, R(λ)/R(550 nm). A wavelength dispersion value (a)_DSP(450 nm) of the (a)-type reversed wavelength dispersion QWP at a wavelength of 450 nm is 0.77. A wavelength dispersion value (b)_DSP(450 nm) of the (b)-type reversed wavelength dispersion QWP at a wavelength of 450 nm is 0.82. A wavelength dispersion value (c)_DSP(450 nm) of the (c)-type reversed wavelength dispersion QWP at a wavelength of 450 nm is 0.86. A wavelength dispersion value (d)_DSP(450 nm) of the (d)-type reversed wavelength dispersion QWP at a wavelength of 450 nm is 0.91.

As shown in FIG. 3, the wavelength dispersion values of the (a) to (d)-type reversed wavelength dispersion QWPs are different from a wavelength dispersion value of an ideal reversed wavelength dispersion QWP.

Figure 4:
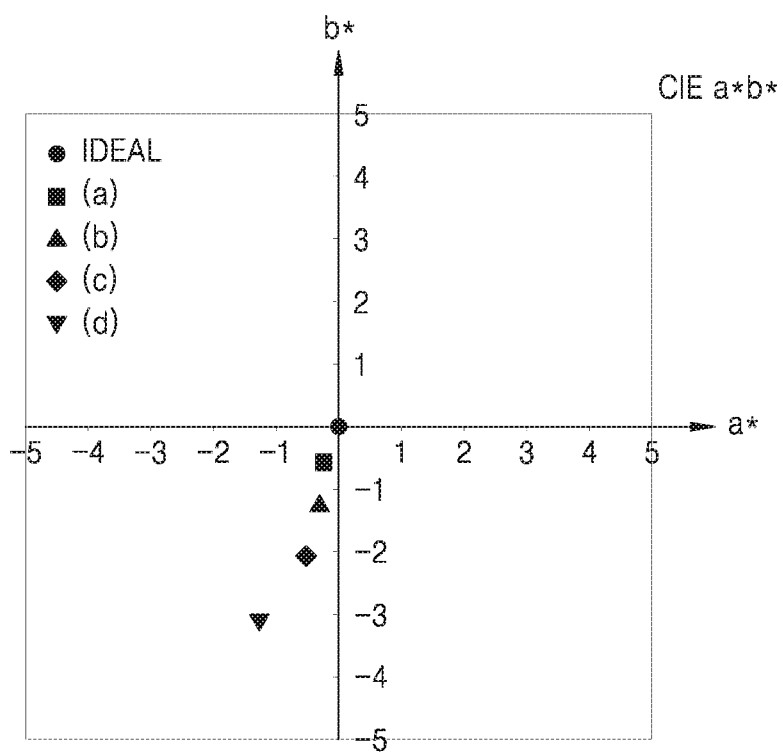
FIG. 4 illustrates reflection chromas of the (a) to (d)-type reversed wavelength dispersion QWPs in CIE L*a*b* coordinates.

Referring to FIG. 4, a chroma of reflected light of the ideal reversed wavelength dispersion QWP in a CIE L*a*b* color space is located at a*=0, b*=0, which means that the chroma of the reflected light of the ideal reversed wavelength dispersion QWP is neutral black.

As a chroma is away from a*=0, b*=0 in a CIE L*a*b* coordinate system, a first quadrant may indicate red, a second quadrant may indicate green, a third quadrant may indicate blue, and a fourth quadrant may indicate purple. For example, a* having negative values may indicate green, whereas positive values may indicate red/purple. In addition, b* having negative values may indicate blue, whereas positive values may indicate yellow.

As shown in FIG. 4, a chroma of reflected light of each of the (a) to (d)-type reversed wavelength dispersion QWPs is located in the third quadrant, and thus, may be represented as blue. The largest color shift may occur in the (d)-type reversed wavelength dispersion QWP having a highest wavelength dispersion value, which may be a cyanic shift. When a chroma of reflected light is away from a*=0, b*=0, it may mean that the chroma of the reflected light has increased. Also, when the chroma of the reflected light increases, it may mean that a color is visually recognized and black visibility is reduced.

Data of FIGS. 3 and 4 are summarized as follows.

|        | DSP(430 nm) | b*    |
|--------|-------------|-------|
| (a)-type | 0.77      | −0.57 |
| (b)-type | 0.82      | −1.22 |
| (c)-type | 0.86      | −2.06 |
| (d)-type | 0.91      | −3.13 |

Referring to the above table, it can be seen that an absolute value of b* increases as a wavelength dispersion value DSP increases.

Accordingly, in order to converge b* to 0, a transmittance in a Z range (e.g., blue range) in a CIE XYZ coordinate system has to be. This may also be derived from the following equation that is a conversion equation of a CIE L*a*b* coordinate system and a CIE XYZ coordinate system.

$$X = X_n f^{-1}\left(\frac{L^* + 16}{116} + \frac{a^*}{500}\right)$$ [Equation 1]

$$Y = Y_n f^{-1}\left(\frac{L^* + 16}{116}\right)$$

$$Z = Z_n f^{-1}\left(\frac{L^* + 16}{116} - \frac{b^*}{200}\right)$$

where $$f^{-1}(t) = \begin{cases} t^3 & \text{if } t > \delta \\ 3\delta^2\left(t - \frac{4}{29}\right) & \text{otherwise} \end{cases}$$

and where δ=6/29

Also, a transmittance at a wavelength of 430 nm or less has to be adjusted in consideration of a blue spectrum emitted from a blue pixel of a display apparatus, and thus, the transmittance has to satisfy the following formula related to a wavelength dispersion value DSP of each reversed wavelength dispersion QWP.

$$T(430 \text{ nm}) \leq 8.7875 e^{(-3.715 \times DSP(450 \text{ nm}))}$$ [Equation 2]

where T(430 nm) denotes a light transmittance at a wavelength of 430 nm. DSP denotes a wavelength dispersion value at a wavelength of 450 nm. The wavelength dispersion value DSP is R(450 nm)/R(550 nm), and R(λ) denotes a phase difference value at a wavelength of λ.

Figure 5:
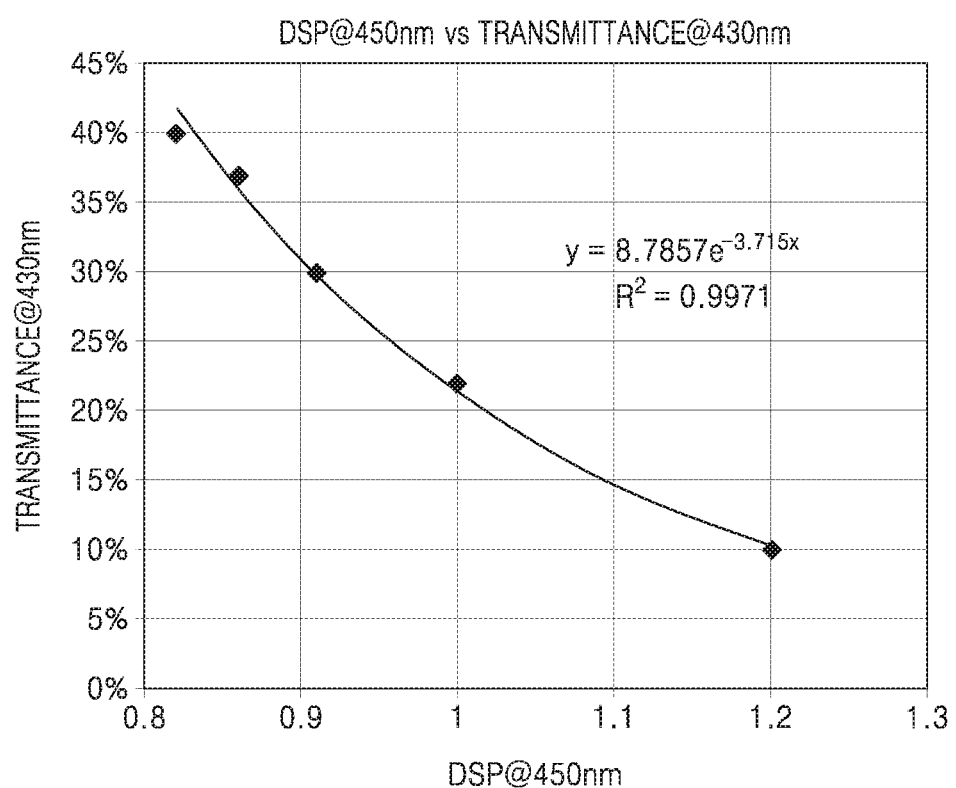
FIG. 5 is a graph showing a relationship between wavelength dispersion values and transmittance of a polarizing film.

A graph of Equation 2 is shown in FIG. 5. FIG. 5 illustrates a relationship between a wavelength dispersion value DSP and a transmittance of a polarizing film. Referring to FIG. 5, a light transmittance at 430 nm decreases as a wavelength dispersion value DSP at 450 nm increases.

Figure 6:
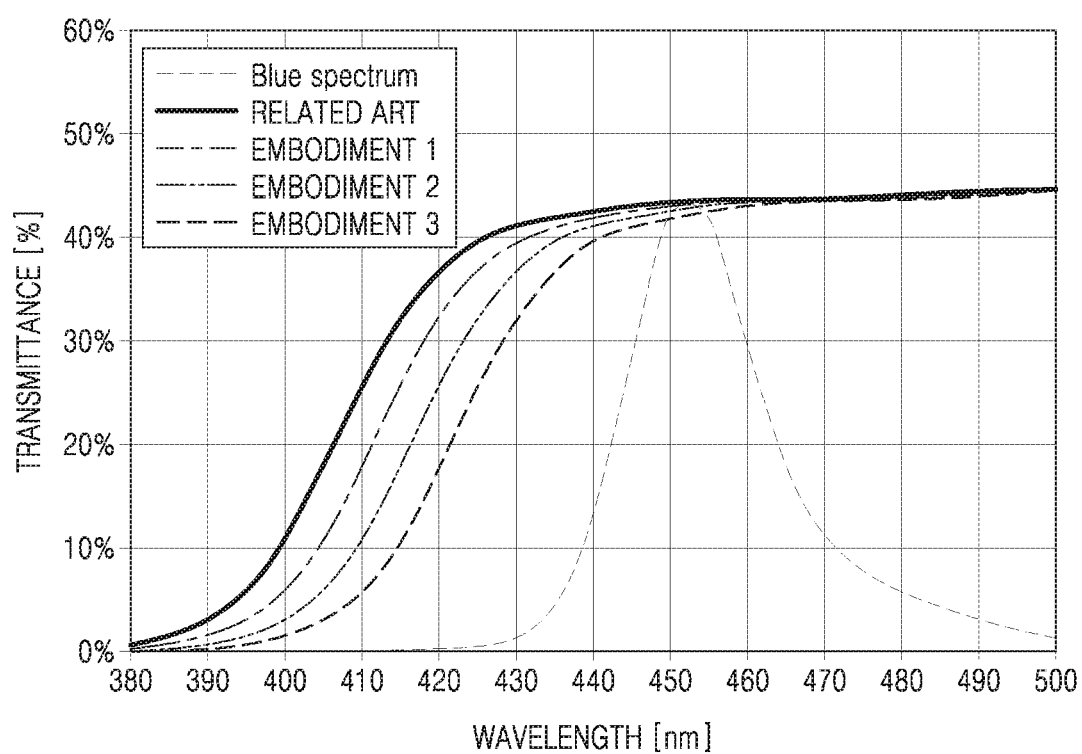
FIG. 6 is a graph showing light transmittances of the related art and exemplary embodiments.
Figure 7:
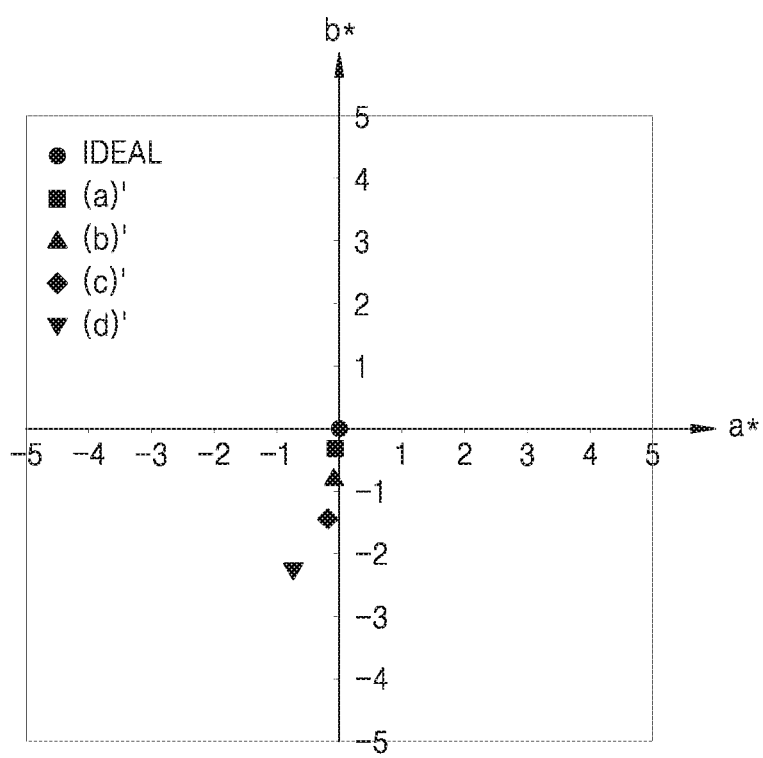
FIG. 7 illustrates chromas of reflected light of the embodiments in a CIE L*a*b* coordinate system.

FIG. 6 is a graph showing light transmittances according to a related art and embodiments, to which the above formula is applied. FIG. 7 illustrates chromas of reflected light of the embodiments in a CIE L*a*b* coordinate system.

In FIG. 6, a light transmittance according to the related art is a light transmittance of a polarizing film that does not include a light-absorbing layer. Embodiments 1 through 3 include a light-absorbing layer. In particular, the embodiment 1 ((b)') includes a (b)-type reversed wavelength dispersion QWP, embodiment 2 ((c)') includes a (c)-type reversed wavelength dispersion QWP, and embodiment 3 ((d)') includes a (d)-type reversed wavelength dispersion QWP.

Referring to FIG. 6, it can be seen that a blue spectrum emitted by a blue pixel of a display pixel is distributed in a range from about 430 nm to about 500 nm. Accordingly, a chroma of reflected light may need to be reduced to the extent that a blue pixel range is not affected, and each of the embodiments 1 through 3 adjusts a light transmittance at 430 nm.

Also, it can also be seen that a light transmittance at 430 nm decreases as a wavelength dispersion value of a reversed wavelength dispersion QWP included in the embodiments increases.

That is, in the embodiment 1 including a reversed wavelength dispersion QWP having a wavelength dispersion value DSP(450 nm) of 0.91, a light transmittance at 430 nm is less than about 30%.

In the embodiment 2 including a reversed wavelength dispersion QWP having a wavelength dispersion value DSP (450 nm) of 0.86, a light transmittance at 430 nm is less than about 37%.

In the embodiment 3 including a reversed wavelength dispersion QWP having a wavelength dispersion value DSP (450 nm) of 0.82, a light transmittance at 430 nm is less than about 40%.

Referring to FIG. 7, (a)' through (d)' correspond to the embodiments, in which a light-absorbing layer is applied to (a) to (d)-type reversed wavelength dispersion QWPs, respectively. It can be seen that a chroma of reflected light in each embodiment is adjusted to be closer to a*=0, b*=0 than that shown in FIG. 4, whereby a light-absorbing layer is not applied.

FIG. 8 is a table showing a change in chroma depending on the presence of a light-absorbing layer. More particularly, the table illustrated in FIG. 8 shows chromas of reflected light of (a) to (d)-type reversed wavelength dispersion QWPs, and chromas of reflected light of (a) to (d)-type reversed wavelength dispersion QWPs to which a light-absorbing layer is applied.

Referring to FIG. 8, it can be seen that when a light-absorbing layer is applied, a chroma of reflected light is reduced by 0.24 to 1. When a chroma is reduced, it may mean that neutral black may be achieved and excellent visibility may be ensured.

A polarizing film according to exemplary embodiments may be applied to a display apparatus.

Figure 9:
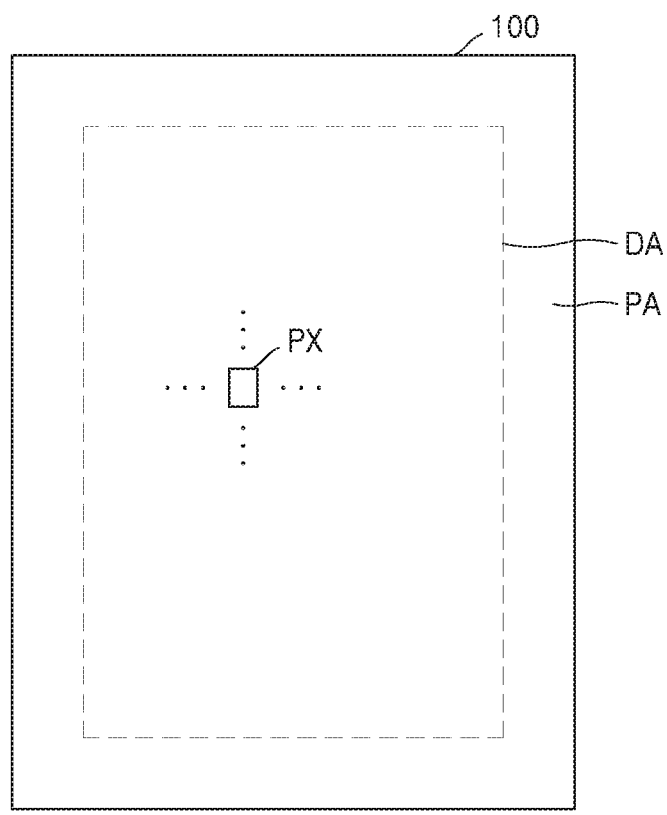
FIG. 9 is a plan view illustrating a display apparatus according to an exemplary embodiment.

FIG. 9 is a plan view of a display apparatus according to an exemplary embodiment.

A plurality of pixels PX including a display element, such as an organic light-emitting diode, may be located in a display area DA of a substrate 100. Each of the pixels PX may further include a plurality of thin film transistors (TFTs) for controlling the display element and a storage capacitor. The number of TFTs included in one pixel is not particularly limited. For example, in some exemplary embodiments, the number of TFTS in one pixel may be 1 to 7.

Various wirings for applying an electrical signal to the display area DA may be located in a peripheral area PA of the substrate 100. A TFT may also be provided in the peripheral area PA, and in this case, the TFT located in the peripheral area PA may be a part of a circuit unit for controlling an electrical signal applied into the display area DA.

Hereinafter, although a display apparatus will be described with reference to an organic light-emitting display apparatus, however, the inventive concepts are not limited thereto. For example, in another exemplary embodiment, any of various display apparatuses, such as an inorganic electroluminescent (EL) display apparatus (inorganic light-emitting display) or a quantum dot light-emitting display may be used.

Figure 10:
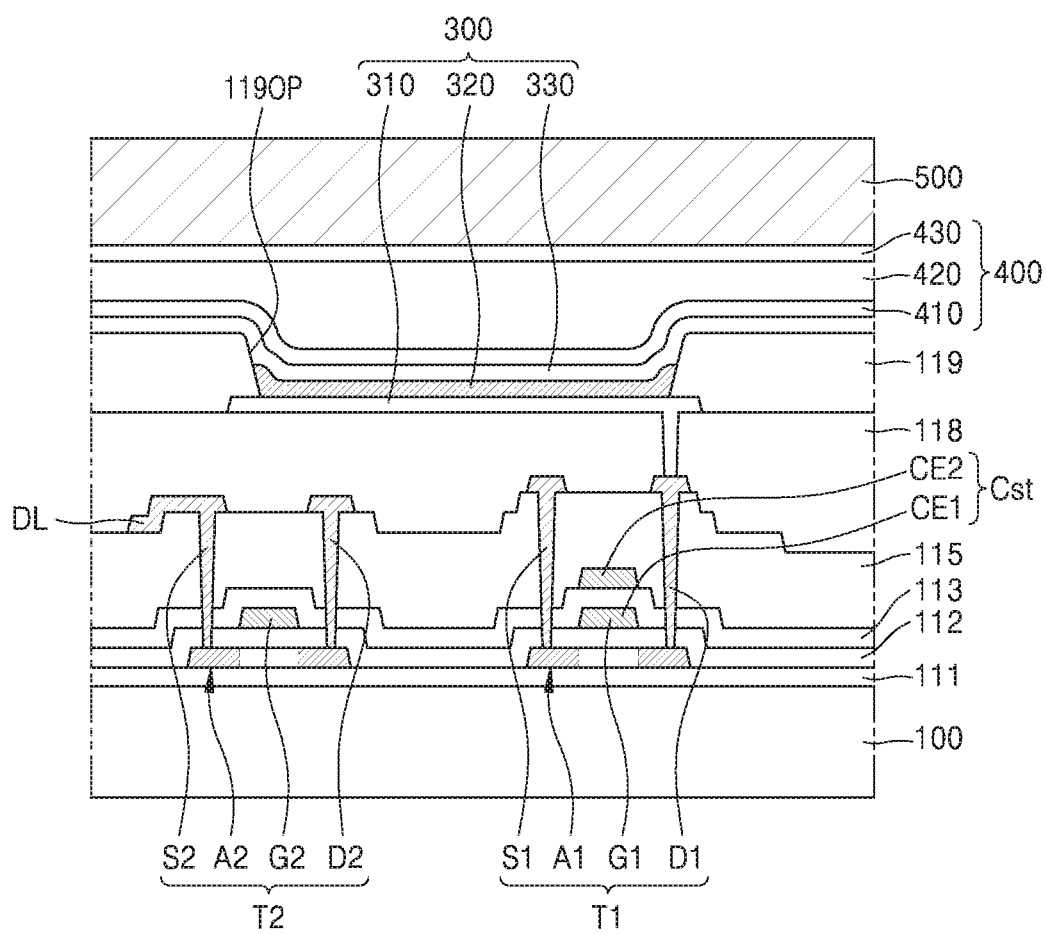
FIG. 10 is a cross-sectional view illustrating a portion of a display apparatus according to an exemplary embodiment.

FIG. 10 is a cross-sectional view illustrating a portion of a display apparatus according to an exemplary embodiment.

Referring to FIG. 10, a display apparatus includes the substrate 100, first and second TFTs T1 and T2 located on the substrate 100, and an organic light-emitting diode 300 electrically connected to the first and second TFTs T1 and T2. Also, the organic light-emitting display apparatus may further include various insulating layers (e.g., a buffer layer 111, a first gate insulating layer 112, a second gate insulating layer 113, an interlayer insulating layer 115, a planarization layer 118, and a pixel-defining film 119) and a storage capacitor Cst.

The substrate 100 may be formed of any of various materials such as a glass material, a metal material, or a plastic material. According to an exemplary embodiment, the substrate 100 may be a flexible substrate, and may include a polymer resin, for example, polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The buffer layer 111 may be located on the substrate 100, may reduce or prevent penetration of a foreign material, moisture, or external air from the bottom of the substrate 100, and may planarize the substrate 100. The buffer layer 111 may include an inorganic material such as oxide or nitride, an organic material, or a combination of an organic material and an inorganic material, and may have a single or multi-layer structure including an inorganic material and an organic material. In some exemplary embodiments, a barrier layer for blocking penetration of external air may be further provided between the substrate 100 and the buffer layer 111. In some exemplary embodiments, the buffer layer 111 may include silicon oxide ($SiO_2$) or silicon nitride ($SiN_x$).

The first TFT T1 and/or the second TFT T2 may be located on the buffer layer 111. The first TFT T1 includes a semiconductor layer A1, a gate electrode G1, a source electrode Si, and a drain electrode D1, and the second TFT T2 includes a semiconductor layer A2, a gate electrode G2, a source electrode S2, and a drain electrode D2. The first TFT T1 may be connected to the organic light-emitting diode 300 and may function as a driving TFT for driving the organic light-emitting diode 300. The second TFT T2 may be connected to a data line DL and may function as a switching TFT. Although two TFTs are illustrated in FIG. 10, the inventive concepts are not limited thereto. The number of TFTs may be modified in various ways. For example, the number of TFTs may be 1 to 7.

Each of the semiconductor layers A1 and A2 may include amorphous silicon or polycrystalline silicon. In another exemplary embodiment, each of the semiconductor layers A1 and A2 may include at least one oxide selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). Each of the semiconductor layers A1 and A2 may include a channel region, and a source region, and a drain region doped with impurities.

The gate electrode G1 is located on the semiconductor layer A1 with the first gate insulating layer 112 therebetween, and the gate electrode G2 is located on the semiconductor layer A2 with the first gate insulating layer 112 therebetween. Each of the gate electrodes G1 and G2 may include molybdenum (Mo), aluminum (Al), copper (Cu), or titanium (Ti), and may have a single or multi-layer structure. For example, each of the gate electrodes G1 and G2 may have a single-layer structure formed of Mo.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may be provided to cover the gate electrodes G1 and G2. The second gate insulating layer 113 may include $SiO_2$, $SiN_x$, SiON, $Al_2O_3$, $TiO_2$, $Ta_2O_5$, $HfO_2$, or $ZnO_2$.

A first storage electrode CE1 of the storage capacitor Cst may overlap the first TFT T1. For example, the gate electrode G1 of the first TFT T1 may perform as a first storage electrode CE1 of the storage capacitor Cst. However, the inventive concepts are not limited thereto. In another exemplary embodiment, the storage capacitor Cst may not overlap the first TFT T1 and may be spaced apart from the first and second TFTs T1 and T2.

A second storage electrode CE2 of the storage capacitor Cst overlaps the first storage electrode CE1 with the second gate insulating layer 113 therebetween. In this case, the second gate insulating layer 113 may function as a dielectric layer of the storage capacitor Cst. The second storage electrode CE2 may include a conductive material including molybdenum (Mo), aluminum (Al), copper (Cu), or titanium (Ti), and may have a single or multi-layer structure including the conductive material. For example, the second storage electrode CE2 may have a single-layer structure formed of Mo, or may have a multi-layer structure formed of Mo/Al/Mo.

The interlayer insulating layer 115 is formed on an entire surface of the substrate 100 to cover the second storage electrode CE2. The interlayer insulating layer 115 may include $SiO_2$, $SiN_x$, SiON, $Al_2O_3$, $TiO_2$, $Ta_2O_5$, $HfO_2$, or $ZnO_2$.

The source electrodes S1 and S2 and the drain electrodes D1 and D2 are located on the interlayer insulating layer 115. Each of the source electrodes S1 and S2 and the drain electrodes D1 and D2 may include a conductive material including Mo, al, Cu, or Ti, and may have a single or multi-layer structure including the conductive material. For example, each of the source electrodes S1 and S2 and the drain electrodes D1 and D2 may have a multi-layer structure formed of Ti/Al/Ti.

The planarization layer 118 may be located on the source electrodes S1 and S2 and the drain electrodes D1 and D2, and the organic light-emitting diode 300 may be located on the planarization layer 118. The organic light-emitting diode 300 includes a first electrode 310, an intermediate layer 320 including an organic emission layer, and a second electrode 330.

The planarization layer 118 may have a flat top surface so that the first electrode 310 is formed flat. The planarization layer 118 may have a single or multi-layer structure including an organic material or an inorganic material. The planarization layer 118 may include benzocyclobutene (BCB), PI, hexamethyldisiloxane (HMDSO), a general-purpose polymer, such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. The planarization layer 118 may include $SiO_2$, $SiN_x$, SiON, $Al_2O_3$, $TiO_2$, $Ta_2O_5$, $HfO_2$, or $ZnO_2$. After the planarization layer 118 is formed, chemical mechanical polishing may be performed to provide a flat top surface.

An opening through which one of the source electrode S1 and the drain electrode D1 of the first TFT T1 is exposed is formed in the planarization layer 118, and the first electrode 310 contacts the source electrode S1 or the drain electrode D1 through the opening to be electrically connected to the first TFT T1.

The pixel-defining film 119 may be located on the first electrode 310. The pixel-defining film 119 defines a pixel by having an opening 119OP corresponding to each subpixel, that is, an opening through which at least a central portion of the first electrode 310 is exposed. Also, the pixel-defining film 119 may prevent an arc or the like from occurring on an edge of the first electrode 310 by increasing a distance between the edge of the first electrode 310 and the second electrode 330. The pixel-defining film 119 may be formed of an organic material, such as PI or HMDSO.

In an exemplary embodiment, a spacer may be located on the pixel-defining film 119. The spacer may prevent damage to a mask during a mask process for forming the intermediate layer 320 of the organic light-emitting diode 300. The spacer may be formed of an organic material, such as PI or HMDSO. The spacer and the pixel-defining film 119 may be formed of the same material at the same time. In this case, a half-tone mask may be used.

The intermediate layer 320 of the organic light-emitting diode 300 may include an organic emission layer EML. The organic emission layer may include an organic material including a fluorescent or phosphorescent material that emits red, green, blue, or white light. The organic emission layer may be formed of a low molecular weight organic material or a high molecular weight organic material, and function layers, such as a hole transport layer (HTL), a hole injection layer (HIL), an electron transport layer (ETL), and an electron injection layer (EIL) may be selectively further located under and over the organic emission layer. The intermediate layer 320 may be located to correspond to each of the plurality of first electrodes 310. However, the inventive concepts are not limited thereto, and the intermediate layer 320 may be modified in various ways. For example, the intermediate layer 320 may be an integrated layer located over all of the first electrodes 310.

The second electrode 330 may be a light-transmitting electrode or a reflective electrode. In some exemplary embodiments, the second electrode 330 may be a transparent or semi-transparent electrode, and may include a metal thin film having a small work function including lithium (Li), calcium (Ca), LiF/Ca, LiF/Al, aluminum (Al), silver (Ag), magnesium (Mg), or a compound thereof. Also, a transparent conductive oxide (TCO) film, such as indium tin oxide (ITO), indium zinc oxide (IZO), ZnO, or $In_2O_3$ may be further located on the metal thin film. The second electrode 330 may be located over the display area DA and the peripheral area PA, and may be located on the intermediate layer 320 and the pixel-defining film 119. The second electrode 330 may be integrally formed with a plurality of the organic light-emitting diodes 300 and may correspond to the plurality of first electrodes 310. Detailed configuration of the organic light-emitting diode 300 will be described below.

A thin-film encapsulation layer 400 for sealing the display area DA may be further provided on the organic light-emitting diode 300. The thin-film encapsulation layer 400 may protect the organic light-emitting diode 300 from external moisture or oxygen by covering the display area DA. The thin-film encapsulation layer 400 may include a first inorganic encapsulation layer 410, an organic encapsulation layer 420, and a second inorganic encapsulation layer 430.

The first inorganic encapsulation layer 410 may cover the second electrode 330, and may include ceramic, metal oxide, metal nitride, metal carbide, metal oxynitride, indium oxide ($In_2O_3$), tin oxide ($SnO_2$), indium tin oxide (ITO), silicon oxide, silicon nitride, and/or silicon oxynitride. If necessary, other layers, such as a capping layer, may be located between the first inorganic encapsulation layer 410 and the second electrode 330. The first inorganic encapsulation layer 410 is formed along a lower structure, and thus, a top surface of the first inorganic encapsulation layer 410 may not be flat as shown in FIG. 10.

The organic encapsulation layer 420 may cover the first inorganic encapsulation layer 410 to have a substantially flat top surface, unlike the first inorganic encapsulation layer 410. In particular, the organic encapsulation layer 420 may be formed so that a portion of the organic encapsulation layer 420 corresponding to the display area DA has a substantially flat top surface. The organic encapsulation layer 420 may include at least one material selected from the group consisting of acryl, methacrylic, polyester, polyethylene, polypropylene, PET, PEN, PC, PI, polyethylene sulfonate, polyoxymethylene, polyarylate, and HMDSO.

The second inorganic encapsulation layer 430 may cover the organic encapsulation layer 420, and may include ceramic, metal oxide, metal nitride, metal carbide, metal oxynitride, $In_2O_3$, $SnO_2$, ITO, silicon oxide, silicon nitride, and/or silicon oxynitride. As the second inorganic encapsulation layer 430 contacts the first inorganic encapsulation layer 410 at an edge outside the display area DA, the organic encapsulation layer 420 may be prevented from being exposed to the outside.

Since the thin-film encapsulation layer 400 includes the first inorganic encapsulation layer 410, the organic encapsulation layer 420, and the second inorganic encapsulation layer 430, even when crack occur in the thin-film encapsulation layer 400 the cracks may not be connected between the first inorganic encapsulation layer 410 and the organic encapsulation layer 420 or between the organic encapsulation layer 420 and the second inorganic encapsulation layer 430 due to the multi layer structure. Accordingly, a path through which external moisture or oxygen penetrates into the display area DA may be prevented or minimized.

Although FIG. 10 shows that the thin-film encapsulation layer 400 is used as an encapsulation member for sealing the organic light-emitting diode 300, however, the inventive concepts are not limited thereto. For example, a sealing substrate closely attached to the substrate 100 by a sealant or a frit may be used as a member for sealing the organic light-emitting diode 300.

According to exemplary embodiments, the polarizing film 500 for improving outdoor visibility is located over the thin-film encapsulation layer 400 or the sealing substrate. The polarizing film 500 may include the reversed wavelength dispersion QWP 510, the polarizing layer 520, and the light-absorbing layer 530 as shown in FIG. 1. In this case, the polarizing film 500 may be formed so that the reversed wavelength dispersion QWP 510 is closer to the thin-film encapsulation layer 400 than the polarizing layer 520.

Also, instead of the polarizing film 500 of FIG. 1, any of the polarizing films 501, 502, and 503 of FIGS. 2A through 2C may be applied.

Various functional layers such as a touchscreen layer and a window may be further provided on the thin-film encapsulation layer 400, and a capping layer for improving light efficiency may be further provided between the second electrode 330 and the thin-film encapsulation layer 400.

A polarizing film according to exemplary embodiments a low reflection chroma, thereby improving the visibility of a display apparatus employing the polarizing film.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A polarizing film comprising:
 a polarizing layer;
 a reversed wavelength dispersion quarter waveplate (QWP) disposed on the polarizing layer; and
 a light-absorbing layer disposed on the polarizing layer,
 wherein the light-absorbing layer comprises a light absorber to absorb light having a wavelength in a range of about 380 nm to about 430 nm,
 wherein the reversed wavelength dispersion QWP satisfies:

$DSP(450\ nm)=R(450\ nm)/R(550\ nm)<1;$ and $DSP(650\ nm)=R(650\ nm)/R(550\ nm)>1,$ and wherein $DSP(\lambda)$ denotes a wavelength dispersion value DSP of the reversed wavelength dispersion QWP at a wavelength of $\lambda$, $R(\lambda)$ denotes a phase difference value at a wavelength of $\lambda$.

2. The polarizing film of claim 1, wherein a light transmittance of the polarizing film to light having a wavelength in a range of about 380 nm to about 430 nm is less than 40%.

3. The polarizing film of claim 1, wherein the light absorber comprises at least one of anthraquinone-based dyes, methine-based dyes, azomethine-based dyes, oxadine-based dyes, azo-based dyes, styryl-based dyes, coumarin-based dyes, porphyrin-based dyes, dibenzofuranone-based dyes, diketopyrrolopyrrole-based dyes, rhodamine-based dyes, kisanten-based dyes, and pyrromethene-based dyes.

4. The polarizing film of claim 1, wherein the light-absorbing layer comprises at least one of tri-acetyl cellulose (TAC), cyclo olefin polymer, and polymethyl methacrylate (PMMA).

5. The polarizing film of claim 1, wherein the light-absorbing layer comprises a pressure-sensitive adhesive.

6. The polarizing film of claim 1, further comprising a first protective layer and a second protective layer respectively disposed on a bottom surface and a top surface of the polarizing layer,
 wherein each of the first protective layer and the second protective layer comprises at least one of tri-acetyl cellulose (TAC), cyclo olefin polymer, and polymethyl methacrylate (PMMA).

7. The polarizing film of claim 1, further comprising an adhesive layer disposed on a bottom surface of the reversed wavelength dispersion QWP.

8. The polarizing film of claim 1, wherein the polarizing layer comprises a dichroic dye in polyvinyl alcohol (PVA).

9. A polarizing film comprising:
 a polarizing layer;
 a reversed wavelength dispersion quarter waveplate (QWP) disposed on the polarizing layer; and
 a light-absorbing layer disposed on the polarizing layer,
 wherein the light-absorbing layer comprises a light absorber to absorb light having a wavelength in a range of about 380 nm to about 430 nm,
 wherein a wavelength dispersion value DSP of the reversed wavelength dispersion QWP at a wavelength of 450 nm and a light transmittance of the polarizing film at a wavelength 430 nm satisfy:

$T(430\ nm) \leq 8.7875 e^{(-3.715 \times DSP(450\ nm))},$ and wherein T(430 nm) denotes a light transmittance at a wavelength of 430 nm, DSP denotes a wavelength dispersion value at a wavelength of 450 nm and is R(450 nm)/R(550 nm), and $R(\lambda)$ denotes a phase difference value at a wavelength of $\lambda$.

10. A display apparatus comprising:
 a substrate;
 a plurality of display elements disposed on the substrate;
 a sealing member sealing the plurality of display elements; and
 a polarizing film disposed on the sealing member, wherein the polarizing film comprises:
a polarizing layer;
a reversed wavelength dispersion quarter waveplate (QWP) disposed on the polarizing layer; and
a light-absorbing layer disposed on the polarizing layer,
wherein the light-absorbing layer comprises a light absorber to absorb light having a wavelength in a range of about 380 nm to about 430 nm,
wherein the reversed wavelength dispersion QWP satisfies:

$DSP(450\ nm)=R(450\ nm)/R(550\ nm)<1$; and $DSP(650\ nm)=R(650\ nm)/R(550\ nm)>1$, and wherein DSP(λ) denotes a wavelength dispersion value DSP of the reversed wavelength dispersion QWP at a wavelength of λ, R(λ) denotes a phase difference value at a wavelength of λ.

11. The display apparatus of claim 10, wherein a wavelength dispersion value DSP of the reversed wavelength dispersion QWP at a wavelength of 450 nm and a light transmittance of the polarizing film at a wavelength 430 nm satisfy:

$T(430\ nm) \leq 8.7875 e^{(-3.715 \times DSP(450\ nm))}$ wherein T(430 nm) denotes a light transmittance at a wavelength of 430 nm, DSP denotes a wavelength dispersion value at a wavelength of 450 nm and is R(450 nm)/R(550 nm), and R(λ) denotes a phase difference value at a wavelength of λ.

12. The display apparatus of claim 10, wherein a light transmittance of the polarizing film to light having a wavelength in a range of about 380 nm to about 430 nm is less than 40%.

13. The display apparatus of claim 10, wherein the light absorber comprises at least one of anthraquinone-based dyes, methine-based dyes, azomethine-based dyes, oxadine-based dyes, azo-based dyes, styryl-based dyes, coumarin-based dyes, porphyrin-based dyes, dibenzofuranone-based dyes, diketopyrrolopyrrole-based dyes, rhodamine-based dyes, kisanten-based dyes, and pyrromethene-based dyes.

14. The display apparatus of claim 10, wherein:
the light-absorbing layer comprises a pressure-sensitive adhesive; and
the light-absorbing layer is disposed between the reversed wavelength dispersion QWP and the sealing member.

15. The display apparatus of claim 10, wherein the sealing member comprises a thin-film encapsulation layer including a first inorganic encapsulation layer, an organic encapsulation layer, and a second inorganic encapsulation layer sequentially stacked one over another.

16. The display apparatus of claim 10, wherein the sealing member comprises a sealing substrate.

17. The display apparatus of claim 10, further comprising a first protective layer and a second protective layer respectively disposed on a bottom surface and a top surface of the polarizing layer,
wherein each of the first protective layer and the second protective layer comprises at least one of tri-acetyl cellulose (TAC), cyclo olefin polymer, and polymethyl methacrylate (PMMA).

18. The display apparatus of claim 10, wherein the light-absorbing layer comprises at least one of tri-acetyl cellulose (TAC), cyclo olefin polymer, and polymethyl methacrylate (PMMA).

* * * * *